United States Patent [19]

Suzuki

[11] Patent Number: 5,219,779
[45] Date of Patent: Jun. 15, 1993

[54] MEMORY CELL FOR DYNAMIC RANDOM ACCESS MEMORY

[75] Inventor: Kohei Suzuki, Kobe, Japan

[73] Assignee: Sharp Kabushiki Kaisha, Osaka, Japan

[21] Appl. No.: 711,867

[22] Filed: Jun. 7, 1991

Related U.S. Application Data

[63] Continuation-in-part of Ser. No. 519,791, Aug. 2, 1990, abandoned.

[30] Foreign Application Priority Data

May 11, 1989 [JP] Japan ................... 1-118439

[51] Int. Cl.$^5$ .................. H01L 21/265; H01L 21/70
[52] U.S. Cl. ......................... 437/47; 437/52; 437/60
[58] Field of Search ............ 437/48, 51, 52, 44, 437/45, 46, 47, 919; 357/26.3; 365/149; 148/DIG. 164

[56] References Cited

U.S. PATENT DOCUMENTS

| | | | |
|---|---|---|---|
| 4,103,342 | 7/1978 | Miersch et al. | 365/149 |
| 4,407,059 | 10/1983 | Sasaki | 437/913 |
| 4,716,548 | 12/1987 | Mochizuki | 357/23.6 G |
| 4,751,557 | 6/1988 | Sunami et al. | 437/49 |
| 4,780,751 | 10/1988 | Nishimoto | 357/23.6 |
| 4,791,610 | 12/1988 | Takemae | 365/149 |
| 4,855,952 | 8/1989 | Kiyosumi | 365/149 |
| 4,882,289 | 11/1989 | Moriuchi et al. | 437/52 |
| 4,888,631 | 12/1989 | Azuma et al. | 357/23.6 |
| 4,888,733 | 12/1989 | Mobley | 365/149 |
| 4,907,047 | 3/1990 | Kato et al. | 357/23.6 |
| 4,958,318 | 9/1990 | Harari | 357/23.6 |

FOREIGN PATENT DOCUMENTS

| | | | |
|---|---|---|---|
| 60-246671 | 12/1985 | Japan | 357/23.6 |
| 60-296670 | 12/1985 | Japan | 357/23.6 |
| 0207055 | 9/1986 | Japan | 357/23.6 |
| 62-137864 | 6/1987 | Japan | 437/52 |
| 0217656 | 9/1988 | Japan | 437/52 |
| 63-261743 | 10/1988 | Japan | 437/52 |

OTHER PUBLICATIONS

Beresford "Special Report IEDM" Electronics International vol. 55 (1982), Dec., No. 25, New York, USA, pp. 138–142.

Sturm "A Three Dimensional Folded Dynamic RAM in Beam-Recrystallized Polysilicon" IEEE Electron Device Letters, vol. EDL-5, No. 5, May 1984, pp. 151–153.

Yoshiji Ohta et al.; A Novel Memory Cell Architecture For High-Density DRAMs; pp. 101–102. Published May, 1989.

Primary Examiner—Olik Chaudhuri
Assistant Examiner—Loc Q. Trinh

[57] ABSTRACT

A dynamic random access memory has a plurality of memory cells, each cell is defined by a substrate made of semiconductor material, a capacitor for storing data, a first transistor connected to one side of the capacitor. The first transistor is formed of a thin film transistor, and a second transistor of the memory cell is connected to the other side of the capacitor. By this arrangement, the size of each memory cell is reduced.

17 Claims, 12 Drawing Sheets

MEMORY CELL FOR DYNAMIC RANDOM ACCESS MEMORY

This application is a continuation-in-part of application Ser. No. 07/519,791 filed Aug. 2, 1990, now abandoned.

BACKGROUND OF THE INVENTION

1. Field of the Invention

The present invention relates to a dynamic random access memory and more particularly, to a MOS dynamic random access memory (referred to hereinbelow as a MOSDRAM).

2. Description of the Related Art

The degree of integration of the MOSDRAM referred to above has been improved four times in the recent three years, with each cell becoming more and more minute and compact in size. Meanwhile, in order to secure high reliability of such memory cell reduced in size, the present applicant has designed a new kind of memory cell for storing 2-bit data by two access transistors and one capacitor, which is disclosed in detail in U.S. patent application Ser. No. 07/455,989 filed Dec. 22, 1989, now abandoned and entitled "Dynamic Semiconductor Memory Device" which corresponds to two Japanese Patent applications (Japanese Patent Application Nos. 63-330970 and 1-68880).

Figure 1:
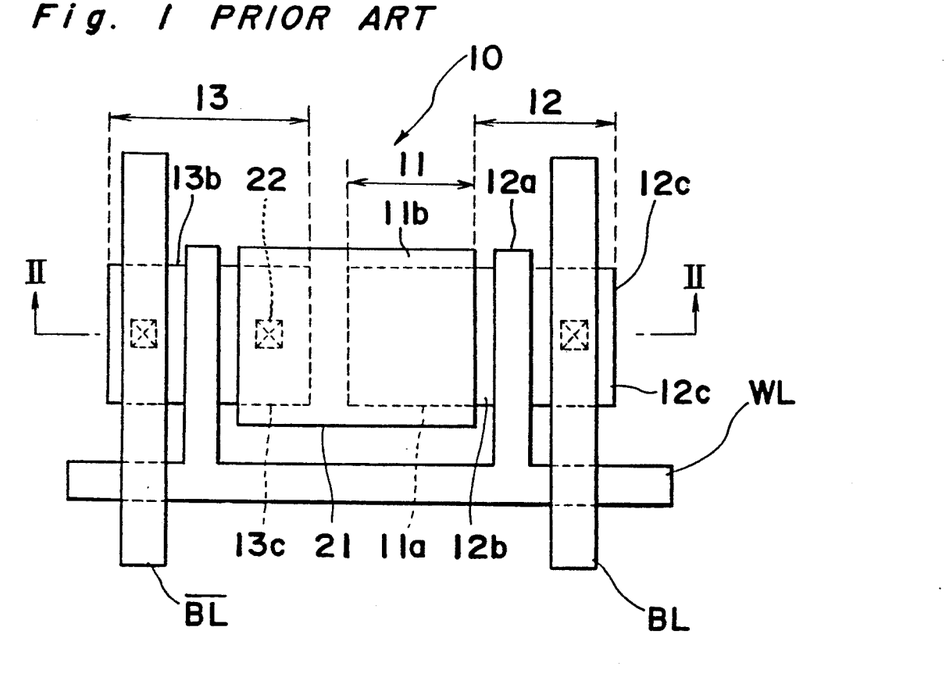
FIG. 1 is a plane view showing the structure of a known memory cell.
Figure 2:
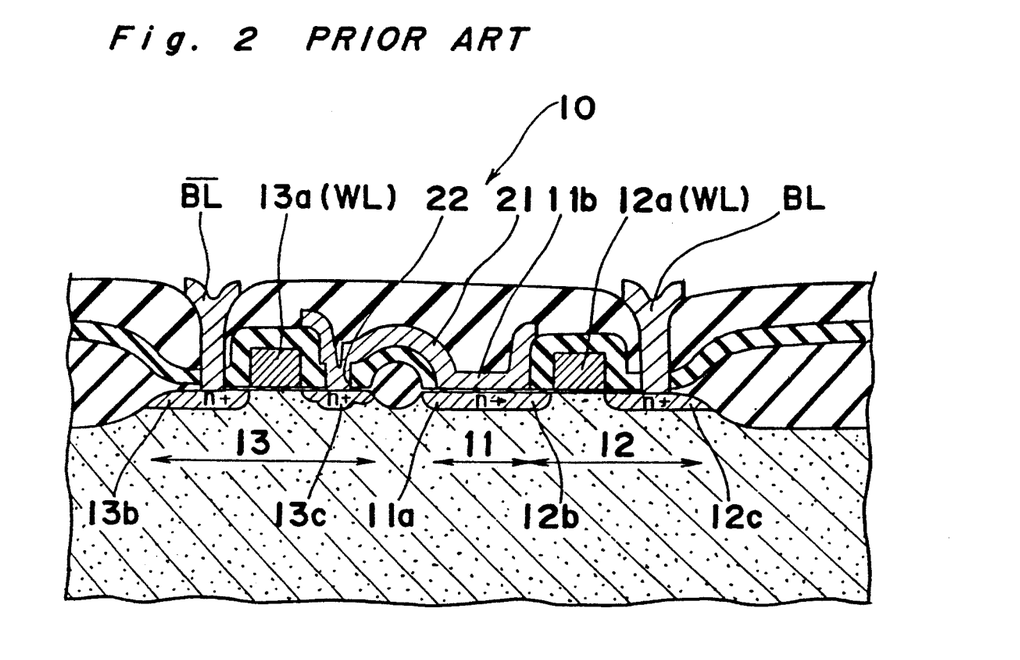
FIG. 2 is a sectional view taken along a line II—II shown in FIG. 1.

Referring to FIGS. 1 and 2, the above-discussed memory cell used in the MOSDRAM is shown, in which FIG. 1 shows a plane view, and FIG. 2 shows a cross-sectional view taken along a line II—II shown in FIG. 1.

Figure 3:
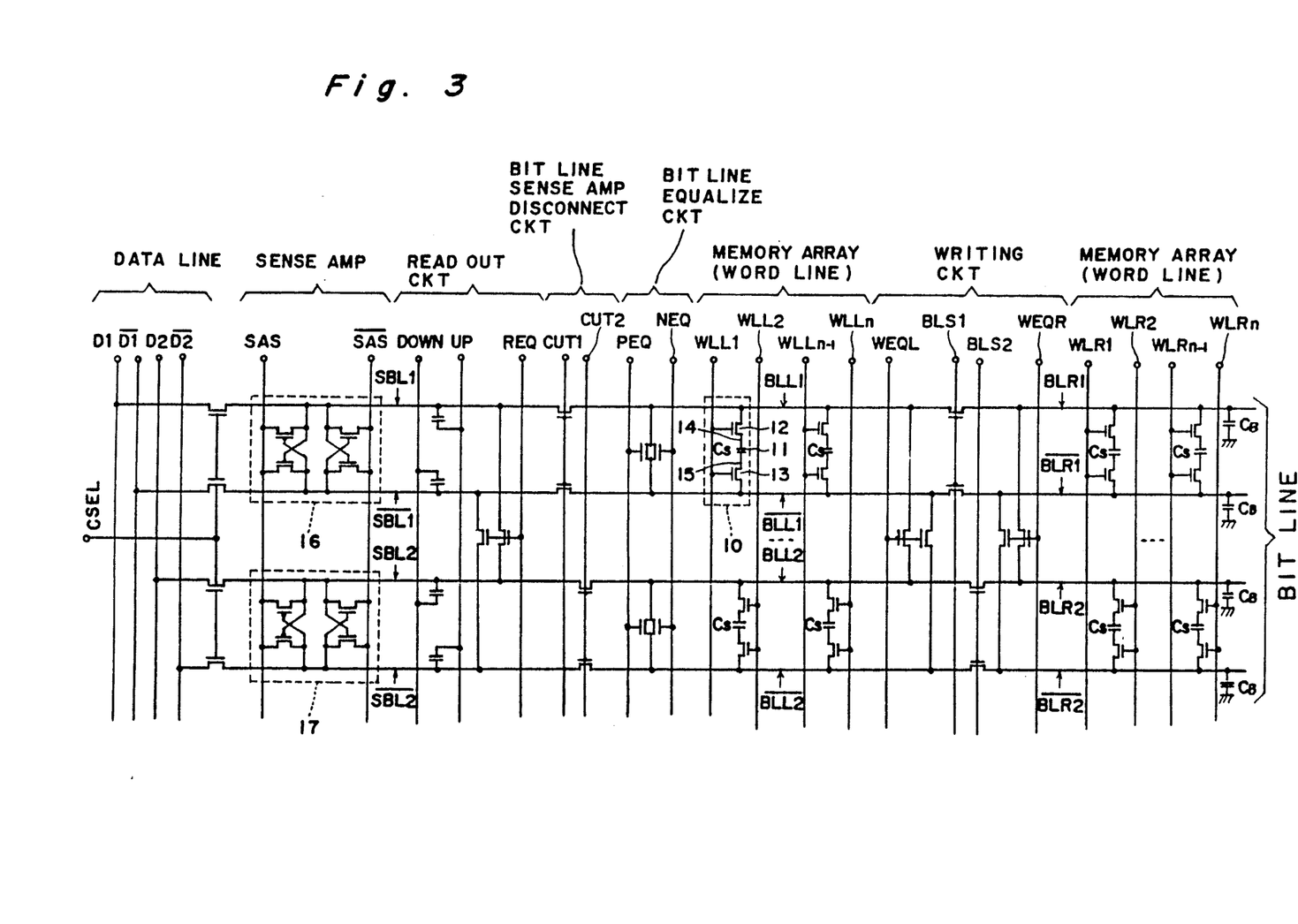
FIG. 3 is a circuit diagram of a DRAM which can store 2-bit data by two access transistors and one capacitor.

The memory cell 10 includes two access transistors 12 and 13, and a memory capacitor 11, which are connected in series as shown in FIG. 3. The first access transistor 12 is formed by a gate 12a, an N+ diffusion area 12b as a source (or a drain) and another N+ diffusion area 12c as a drain (or a source). The second access transistor 13 is formed by a gate 13a, an N+ diffusion area 13b as a source (or a drain) and another N+ diffusion area 13c as a drain (or a source). The memory capacitor 11 has a lower electrode defined by an N+ diffusion area 11a which is in common with the N+ diffusion area 12b of the first transistor 12, and an upper electrode 11b defined by a polysilicon film layer 21.

A connecting hole 22 connects the drain of the transistor 13 with the upper electrode 21 of the capacitor 11. Reference WL represents a word line (a first polysilicon film layer) and references BL and $\overline{BL}$ indicate bit lines (metal films) which will be used for storing data in the capacitor 11.

The MOSDRAM employing the above described memory cell 10, which is disclosed fully in the above-mentioned U.S. Patent application, is explained hereinbelow.

Figure 4:
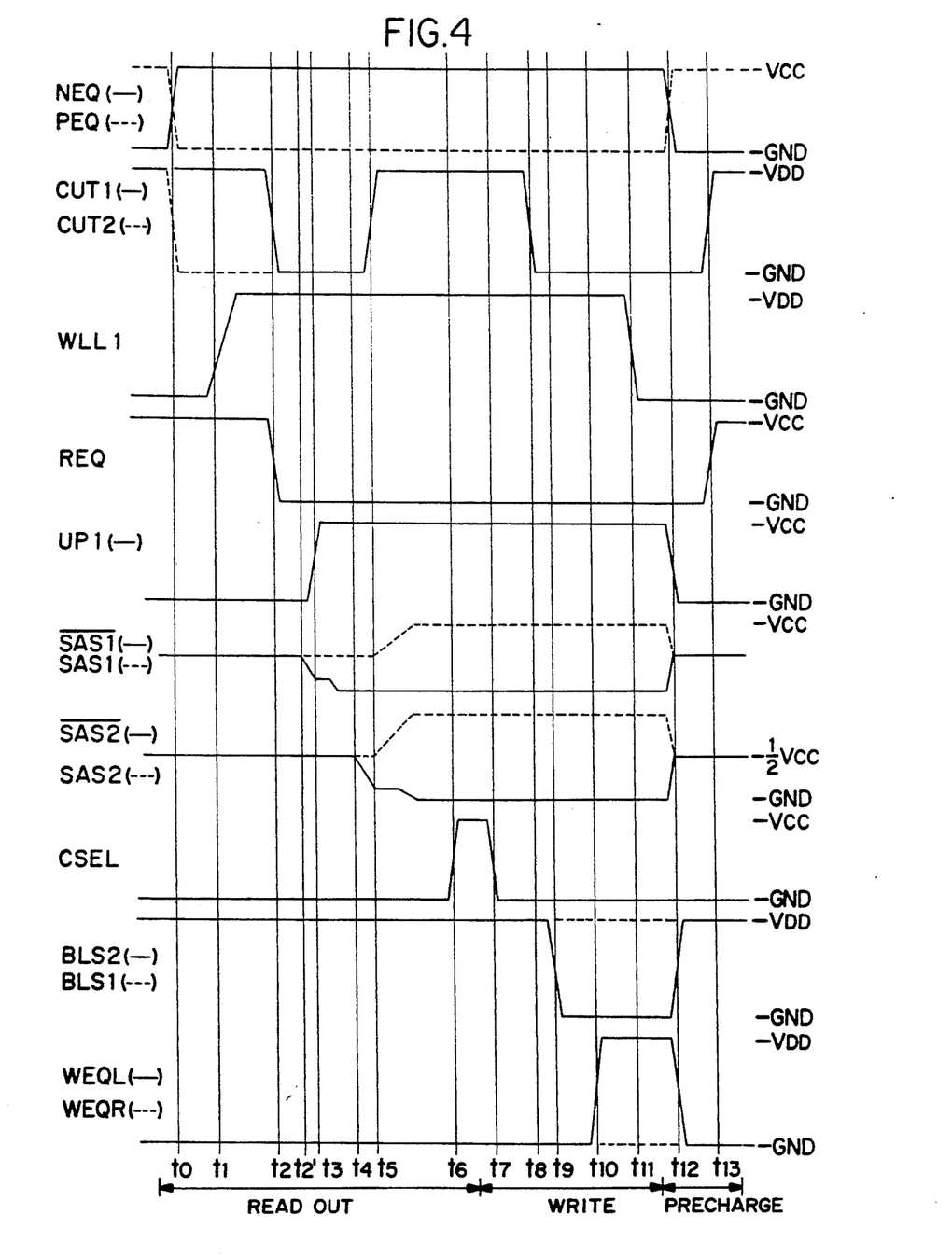
FIG. 4 is a waveform of an input signal illustrating the operation of the DRAM of FIG. 3.
Figure 5:
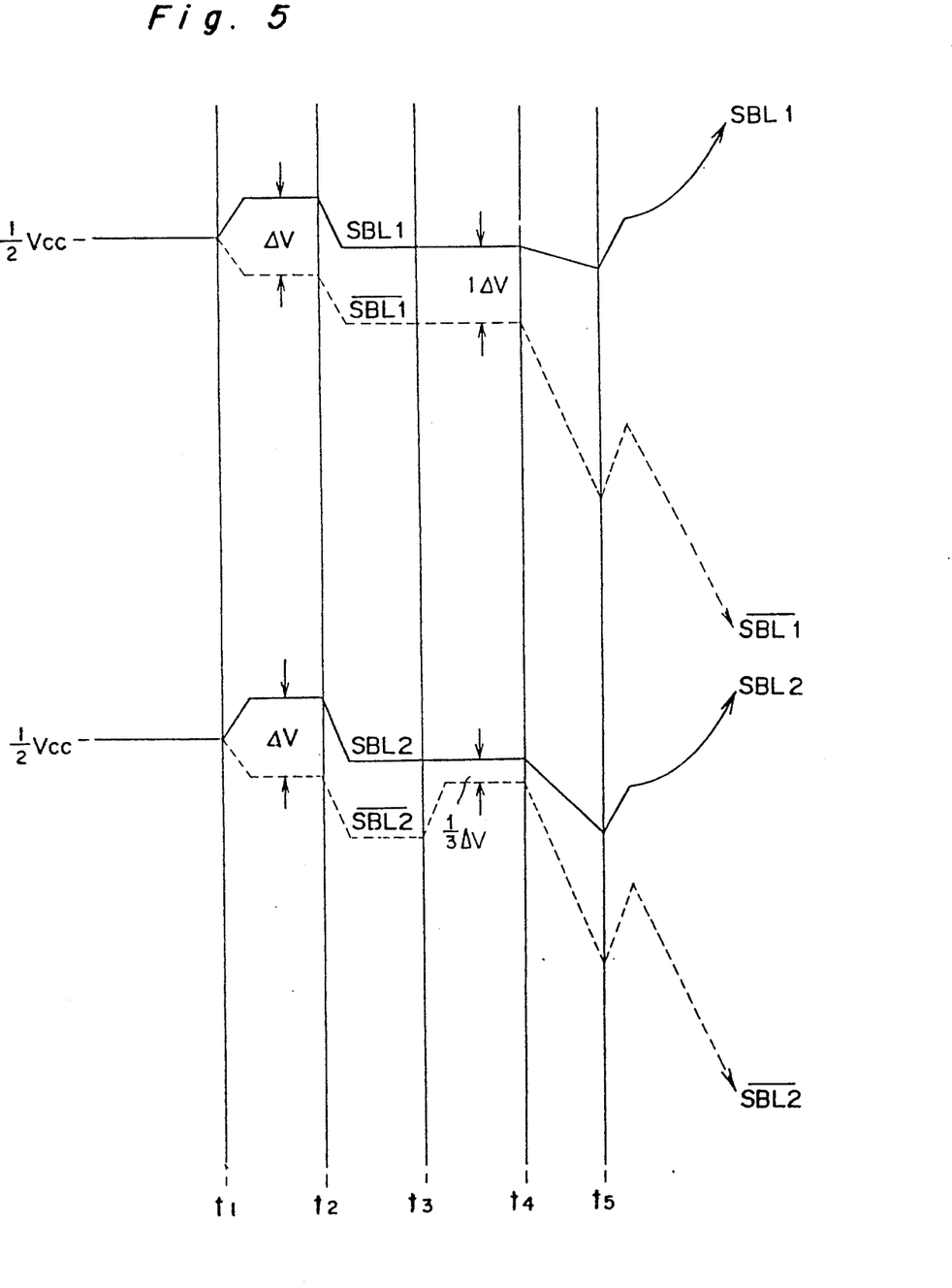
FIGS. 5 and 6 are waveforms of bit lines when data is read out.
Figure 6:
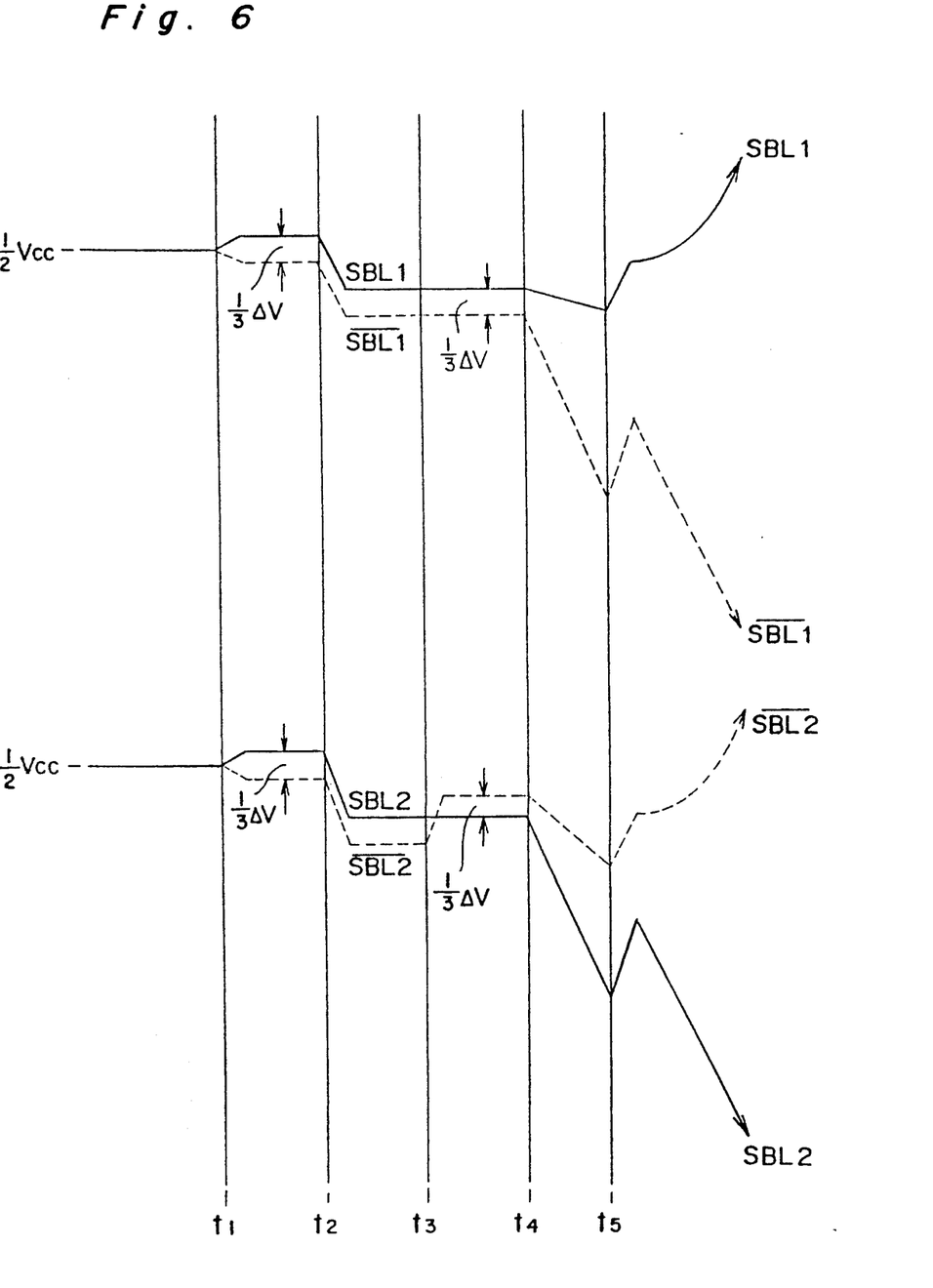

In the drawings, FIG. 3 shows a circuit structure of the MOSDRAM; FIG. 4 shows waveforms of input signals; and FIGS. 5 and 6 show a waveform of potential in a bit line when data is read out.

Referring to FIG. 3, the memory cell (for 2 bits) 10 includes a memory capacitor 11, a first access transistor 12, a second access transistor 13, and storage nodes 14 and 15. The memory cell 10 is provided in association with sense amplifiers 16 and 17.

The operation, particularly of the memory cell 10 selected by the signals from a word line WLL1 and bit lines BLL1 and BLL1, is explained hereinbelow from the viewpoints of (1) reading, (2) re-writing, (3) pre-charging and (4) writing.

(1) Reading Operation

As shown in FIG. 4, when signals NEQ and PEQ change at a time t0, all of the transistors in a bit line equalizing circuit of FIG. 3 are turned off, and every bit line is precharged to $\frac{1}{2}$ Vcc.

Subsequently, when the memory cell 10 connected to lines BLL1 and BLL1 is selected, transistors connected to line CUT2 are turned off, making the word line WLL1 HIGH level at a time t1.

Accordingly, an electric charge of data stored in the memory capacitor 11 is transferred to bits lines BLL1, BLR1, SBL1, SBL2 and $\overline{BLL1}$, $\overline{BLR1}$, $\overline{SBL1}$, $\overline{SBL2}$.

Furthermore, at a time t2, when CUT1 and REQ are set to a LOW level, bit lines and sense amplifiers at the side of the memory cell are disconnected and, in turn, the connection between SBL1 and SBL2, and between $\overline{SBL1}$ and $\overline{SBL2}$ are also cut off. As a result, the same data of the memory cell 10 is held by sense amplifiers 16 and 17 individually. At time t'2, the sense amplifier is activated.

At the change of UP1 at a time point t3 as shown in FIG. 4, $\overline{SAS2}$ starts the sense amplifier 17 at a time point t4, allowing CUT1 and CUT2 to rise at a time point t5. Accordingly, sense amplifiers and bit lines at the side of the memory cell are connected, whereby a pull-up by $\overline{SAS1}$ and $\overline{SAS2}$ is performed.

Finally, at a time point t6, CSEL is rendered high to transfer the amplified data of the memory cell to data lines. Thus, the reading operation is completed.

In connection with the above, the signal change of bit lines SBL1, $\overline{SBL1}$ and SBL2, $\overline{SBL2}$ a time point t3 will be described in detail.

According to this memory cell, because 2-bit data is stored in one memory capacitor, storage nodes 14 and 15 represent four voltage states as shown in Table 1 when the memory cell holds the data. A word "data" in Table 1 designates data to be outputted to data lines D1 and D2, with "H" and "L" corresponding to Vcc and GND voltages.

TABLE 1

| Data | D1 = H<br>D2 = H | D1 = H<br>D2 = L | D1 = L<br>D2 = H | D1 = L<br>D2 = L |
| --- | --- | --- | --- | --- |
| Node 14 | Vcc | 2/3 Vcc | 1/3 Vcc | GND |
| Node 15 | GND | 1/3 Vcc | 2/3 Vcc | Vcc |

The state when data of D1=H, D2=H is read out is shown in FIG. 5, while the state when data of D1=H, D2=L is read out is shown in FIG. 6. It is equivalent for the case when data of D1=L, D2=L is read out to the state of FIG. 5 if SBL1 and SBL2 are exchanged respectively with $\overline{SBL1}$ and $\overline{SBL2}$, and also for the case when data of D1=L, D2=H is read out to the state of FIG. 6 if SBL1 and SBL2 are exchanged respectively with $\overline{SBL1}$ and $\overline{SBL2}$, and therefore, the following description is directed only to the preceding two cases in Table 1.

In the case where data of D1=H, D2=H is read out, at time point t1 when word lines are high, a potential difference ΔV is generated between a pair of complementary bit lines, as shown in FIG. 5. The potential at each of SBL1 and $\overline{SBL2}$ is raised $\frac{2}{3}$ΔV by UP1 signal at time point t3.

However, the potential of SBL2 is not reversed with that of $\overline{SBL2}$. After sensing at time point t4 and thereafter, the level of Vcc is outputted to both D1 and D2.

In the meantime, when data of D1=H, D2=L is to be read out, at time point t1 when word lines are lowered, only a potential difference of $\frac{1}{8}\Delta V$ is generated between a pair of complementary bit lines, as shown in FIG. 6. Therefore, when the potential of SBL2 is raised by $\frac{3}{8}\Delta V$ by UP1 signal at time point t3. As the potential difference between $\overline{SBL2}$ and SBL2 is only $\frac{1}{4}\Delta V$, the potential of SBL2 is reversed with the potential of $\overline{SBL2}$. Accordingly, after sensing at time point t4 and thereafter, the level of Vcc is outputted to D1, with GND level being outputted to D2.

The value of $\frac{1}{8}\Delta V$ is represented by:

$$\tfrac{1}{8}\Delta V = \frac{CS}{CB + 2CS} \cdot \tfrac{1}{2}Vcc$$

wherein CB represents a parasitic capacitance of a bit line and CS represents a memory capacitance of a memory cell. If CB/CS ratio is not smaller than 2, $\frac{1}{8}\Delta V$ is larger than the conventional value using one bit CS, namely, $$\Delta V = \frac{CS}{CB + CS} \cdot \tfrac{1}{2}Vcc$$

Considering the fact that the practical CB/CS ratio is more or less 10, the instant system is superior in terms of the reading voltage of bit lines, that is, the margin for reading.

(2) Re-Writing Operation

Referring to FIG. 4, CSEL is lowered at a time point t7 to disconnect data lines. Then, at a time point t8, CUT1 and CUT2 are also lowered to disconnect sense amplifiers.

Accordingly, bit lines at the side of the memory cell are brought into a floating state. Thereafter, BLS2 is allowed to fall at a time point t9, so that bit lines BLL2, BLR2 and $\overline{BLL2}$, $\overline{BLR2}$ not connected with memory cell 10 are divided into two.

Subsequently, WEQL at the side connected with memory cell 10 is rendered high at a time point t10. Thereby BLL2 is connected with BLL1 and BLR1, and $\overline{BLL2}$ is connected with $\overline{BLL1}$ and $\overline{BLR1}$.

In consequence to this, the potential shows such change as indicated in Table 2. The same voltage as is exerted before word lies are turned to be high is written into storage nodes 14 and 15 of selected memory cell 10, and the charge corresponding to the voltage is stored in memory capacitor 11.

TABLE 2

| Data | D1 = H<br>D2 = H | D1 = 1<br>D2 = L | DL = L<br>D2 = H | D1 = L<br>D2 = L |
|---|---|---|---|---|
| $\overline{BLL1},\overline{BLR1}$<br>Node 14 | Vcc<br>Vcc | Vcc<br>GND | GND<br>Vcc | GND<br>GND |
| * BLL 2 | | | | |
| BLL1,BLR1<br>Node 15 | GND<br>GND | GND<br>Vcc | Vcc<br>GND | Vcc<br>Vcc |
| ⌞ Bll 2 | | | | |

TABLE 2-continued

| Data | D1 = H<br>D2 = H | D1 = 1<br>D2 = L | DL = L<br>D2 = H | D1 = L<br>D2 = L |
|---|---|---|---|---|
| $\overline{BLL1},\overline{BLR1}$<br>BLL2<br>* Node 14 | Vcc | $\tfrac{3}{4}$Vcc | $\tfrac{1}{4}$Vcc | GND |
| BLL1,BLR1<br>BLL 2<br>Node 15 | GND | $\tfrac{1}{4}$Vcc | $\tfrac{3}{4}$Vcc | Vcc |

Note:
* indicates before t10, and
** indicates after t10

Thus, when word line WLL1 is rendered high at a time point t11, the rewriting operation is finished.

(3) Precharging Operation

In the succeeding precharging operation, at a time point t12, UP, DOWN, DLS2, WEQL, NEQ and PEQ are turned to the initial state of the cycle. The voltage at bit lines at the side of the memory cell is all reduced to $\frac{1}{2}$Vcc by dividing the electric charge. At the same time, the voltage of SAS and $\overline{SAS}$ is returned to $\frac{1}{2}$Vcc for stopping the sense amplification.

At a time point t13, CUT1, CUT2 and REQ are allowed to rise which completes the precharging operation.

(4) Writing Operation

At the time of reading, data lines are held in the floating state until CSEL becomes high at time point t6 of FIG. 4. On the contrary, at the time of writing, these data lines are fixed to H(Vcc) or L(GND) for writing data. After time point t6, reading data in bit lines are replaced with the writing data.

Then, at time point t7 and thereafter, the same operation as in the rewriting operation is executed for new data to be written into the memory cell.

Figure 7:
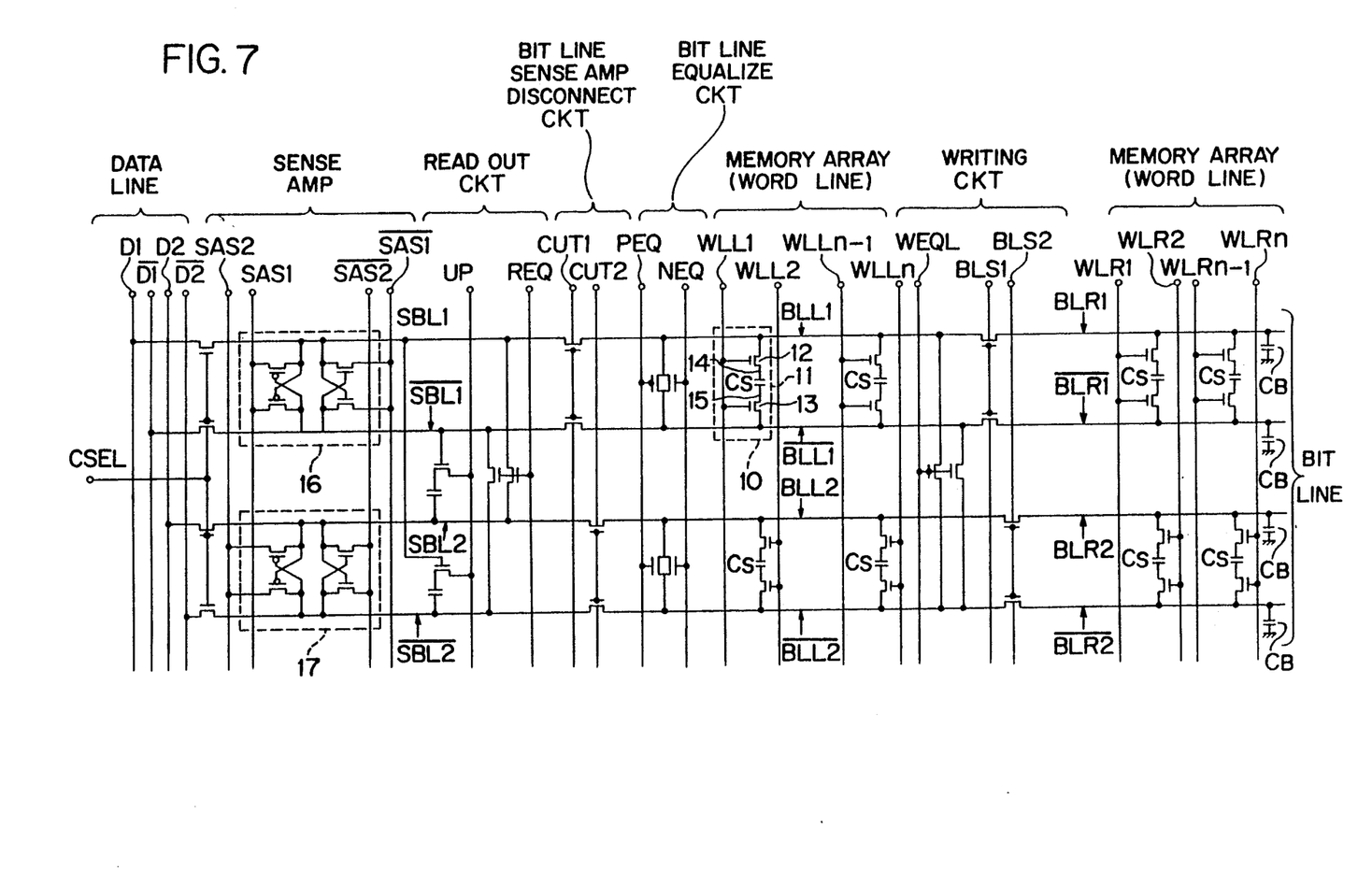
FIG. 7 is a circuit diagram of another DRAM which stores 2-bit data by two access transistors and one capacitor.

Another example is seen in FIG. 7, which is different from the example of FIG. 3 in that no transistor having WEQR for a writing circuit provided as a gate is required. In addition, two kinds of sense amplifiers are provided for respective SAS and $\overline{SAS}$ (SAS1, SAS2, $\overline{SAS1}$ and $\overline{SAS2}$). Therefore, if the operation of the sense amplifier 17 is delayed from the sense amplifier 16, the capacitor of the reading circuit can only function with UP signals, and only SBL2 and $\overline{SBL2}$ be boosted.

As shown in FIGS. 1 and 2, the memory cell requires the connecting hole to be formed such that the upper electrode of second polysilicon film layer of the memory capacitor is connected with the drain of the second transistor, causing difficulties in reduction of the area of a memory cell. As a result, it has been impossible for an LSI to be highly integrated.

SUMMARY OF THE INVENTION

Accordingly, the present invention has been developed with a view to substantially eliminate the above-described disadvantage, and has for its essential object to provide an improved dynamic random access memory.

In accomplishing the above-described object, the present invention employs, for a second transistor, a thin film transistor formed by a part of a thin film (polysilicon film, etc.) including an upper electrode of a memory capacitor.

According to the present invention, a connecting hole for connecting the upper electrode of memory capacitor with the second transistor becomes unnecessary. Thereby, a reduction in the area of a memory cell is achieved as well as a reduction in the size of a chip to realize a highly integrated LSI. Moreover, the manufacturing of the highly integrated LSI is reduced.

BRIEF DESCRIPTION OF THE DRAWINGS

This and other objects and features of the present invention will become apparent from the following description taken in conjunction with preferred embodiments thereof with reference to the accompanying drawings, in which.

DESCRIPTION OF THE PREFERRED EMBODIMENTS

Figure 8:
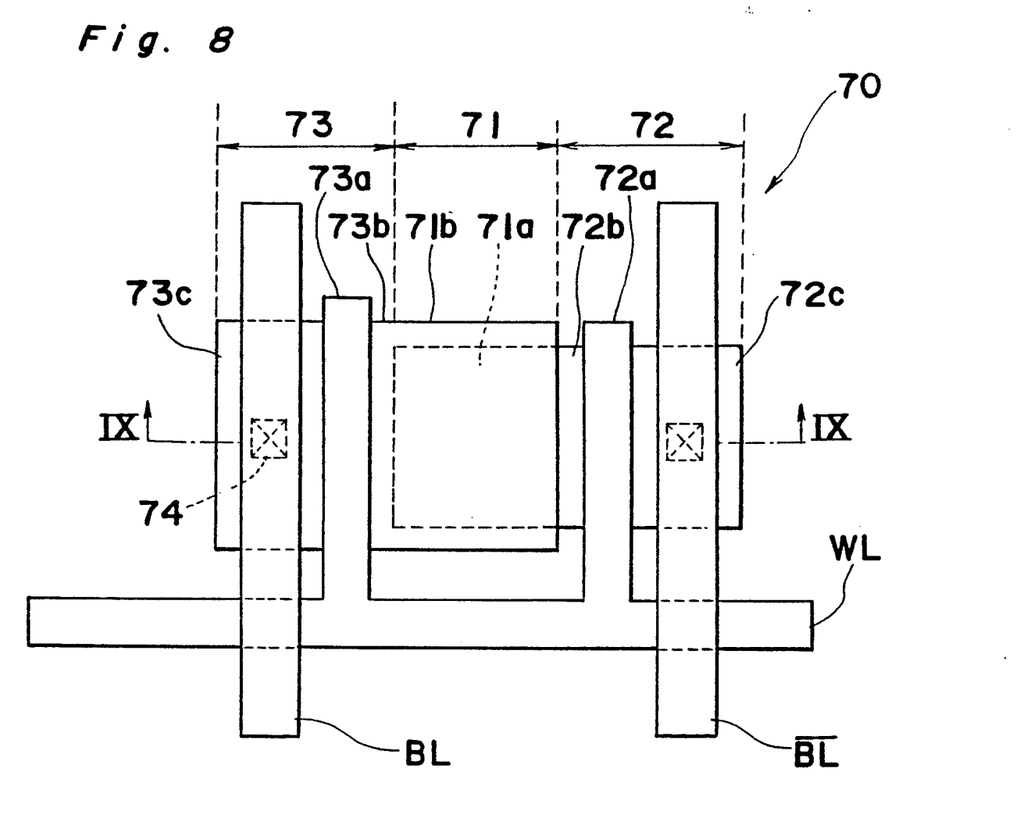
FIG. 8 is a plane view showing the structure of a memory cell according to a first embodiment of the present invention.
Figure 9:
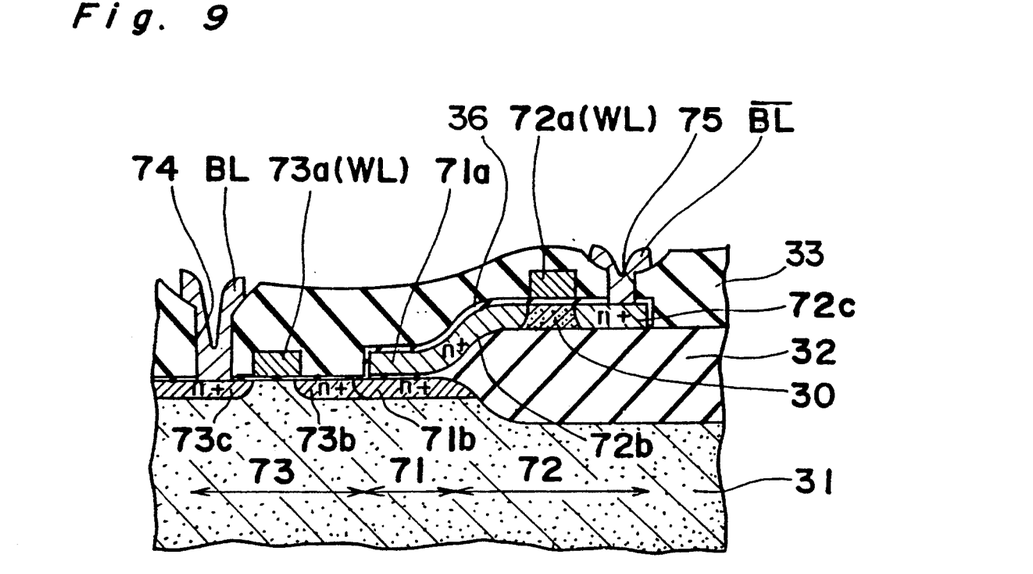
FIG. 9 is a cross-sectional view taken along a line IX—IX shown in FIG. 8.

Referring to FIGS. 8 and 9, the structure of a memory cell according to a first embodiment of the present invention is shown. Specifically, FIG. 8 shows a plane view of the memory cell, and FIG. 9 shows a cross-sectional view taken along the line IX—IX shown in FIG. 8.

Referring to FIGS. 8 and 9, a first access transistor 72 is made of a MOS transistor and is formed on a semiconductor substrate, such as a silicon substrate 31. Deposited over the silicon substrate 31 is an insulation layer 32, e.g., an oxide layer. Deposited over the insulation layer 32 is a semiconductor layer, such as a first polysilicon layer 30. As will be described in detail later, portions of the first polysilicon layer 30 are made to be N+ regions by a phosphorus diffusion so as to define a drain (or a source) 72c and a source (or a drain) 72b of the first access transistor 72. The gate of the first access transistor 72 is formed by an electrode 72a deposited over the polysilicon layer 30 via an insulation layer 36. The gate 72a is used as the word line WL. An electrode $\overline{BL}$ extends through a window 75 formed through an insulation layer 33 and is connected to the drain 72c of the first access transistor 72. The electrode $\overline{BL}$ is used as the bit line.

A memory capacitor 71 is formed by an N+ region 71b formed in the silicon substrate 31 and a portion 71a of the first polysilicon layer 30 which is placed over the N+ region 71b through the insulation layer 32.

A second access transistor 73 is formed by a part of the silicon substrate 31 forming N+ regions 73b and 73c, serving as a drain and a source, respectively, and an electrode 73a, serving as a gate, extending over the silicon substrate 31 through the insulation layer 32. The gate 73a is used as the word line WL. Since the N+ region 73b is formed integrally with the region 71b, the capacitor 71 and the second access transistor 73 are connected in series. An electrode BL extends through a window 74 formed through the insulation layer 33 and is connected to the region 73c of the second access transistor 73. The electrode BL is used as the bit line.

The manufacturing method of the memory cell having the above-described structure will be explained hereinbelow with reference to FIGS. 10a–10g.

Process 1

Figure 10A:
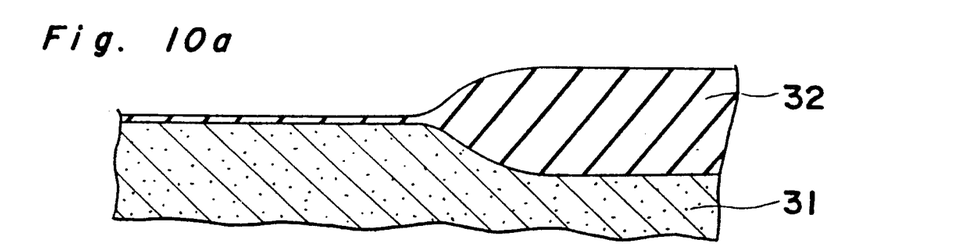
FIGS. 10a through 10g are cross-sectional views showing the steps for forming the memory cell of FIG. 8.

(FIG. 10a)

An insulation layer such as a field SiO$_2$ layer 32 is formed on a P-type silicon substrate 31 by a known method, such as an LOCOS method.

Process 2

Figure 10B:
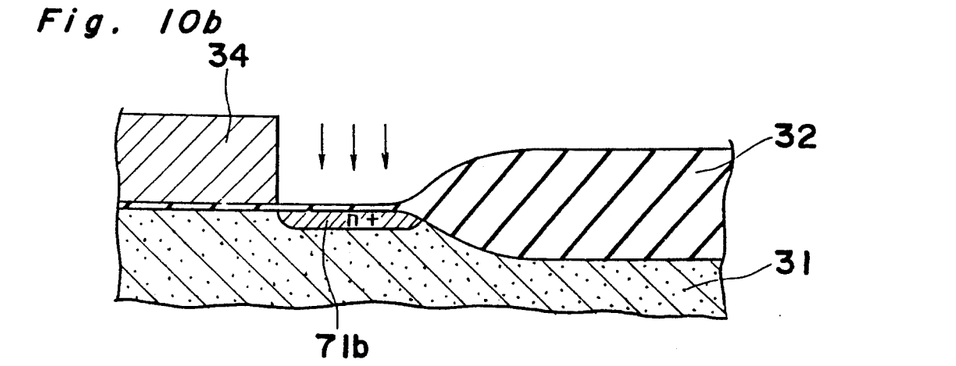

FIG. 10b)

Using a photoresist mask 34, an As ion $^{75}AS+$ is selectively injected into a position where a lower electrode of the memory capacitor is to be formed by photolithography, thereby forming an N+ diffusion layer 71b in the p-type silicon substrate 31.

Process 3

Figure 10C:
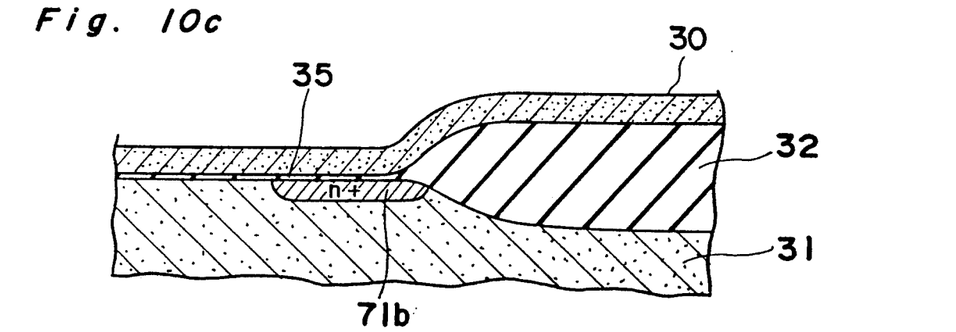

(FIG. 10c)

A capacitor insulating film 35 is formed by CVD or thermal oxidation, and then a first polysilicon film layer 30 is formed thereon.

Process 4

Figure 10D:
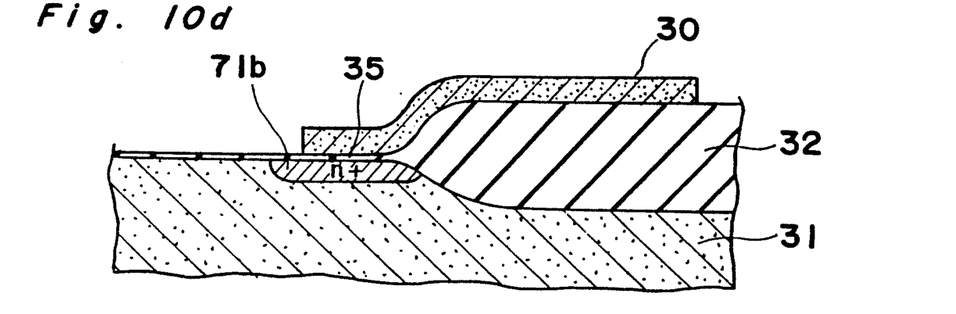

(FIG. 10d)

The first polysilicon film layer 30 is partly removed by the process of photoetching so that a semiconductor film layer 30 partly extends over the field SiO$_2$ layer 32 and also over the N+ diffusion layer 71b.

Process 5

Figure 10E:
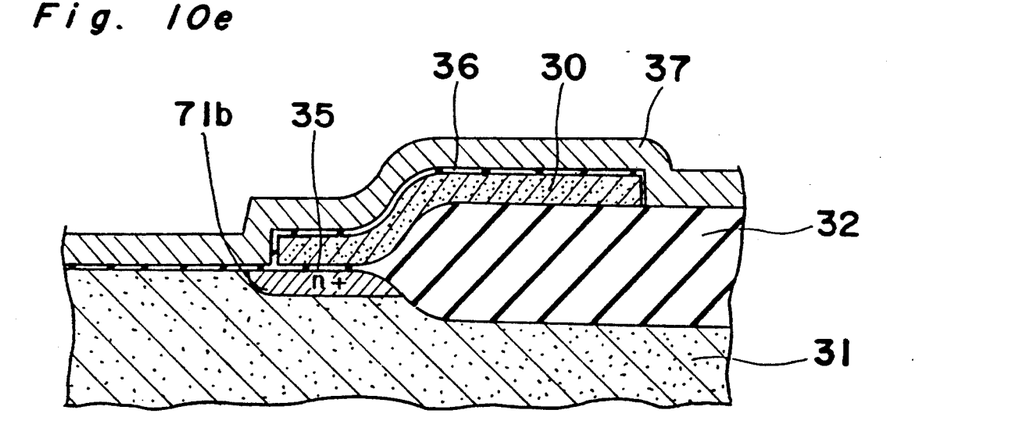

(FIG. 10e)

An insulation layer, such as an oxide film 36, is formed on an active area and the first polysilicon film layer 30 by thermal oxidation, and subsequently a second polysilicon film layer 37 is formed by CVD. The second polysilicon film layer 37 is doped with phosphorous diffusion so that the second polysilicon film layer 37 becomes an electrically conductive layer.

Process 6

Figure 10F:
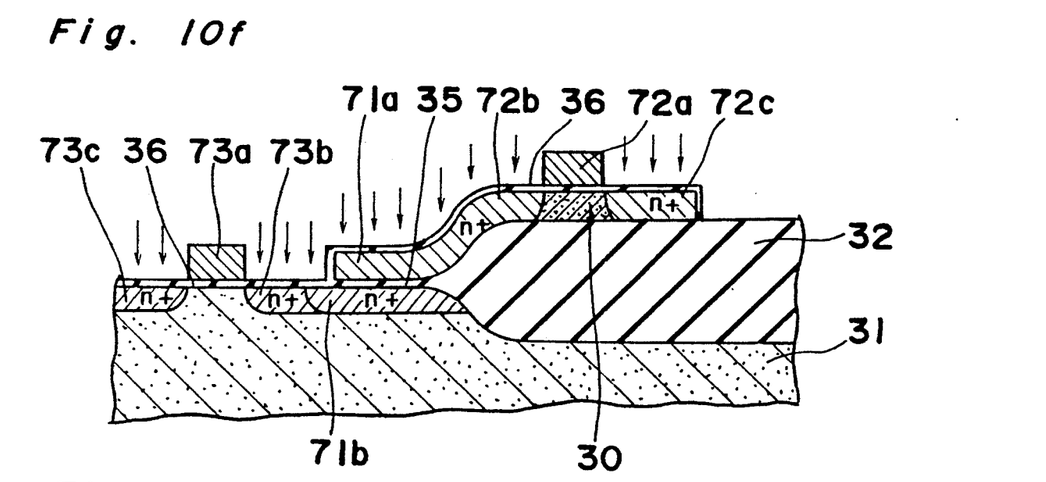

(FIG. 10f)

Parts of the second polysilicon film layer 37 are removed by photoetching, thereby forming areas 72a and 72a which will serve as gate electrodes for the first and second access transistors, respectively.

Process 7

(FIG. 10f)

Furthermore, ion injection is effected as shown by arrows to source and drain electrodes 72b and 72c of the first access transistor 72, and source and drain electrodes 73b and 73c of the second access transistor 73. At the same time, an upper electrode 71a of the memory capacitor is formed.

Process 8

Figure 10G:
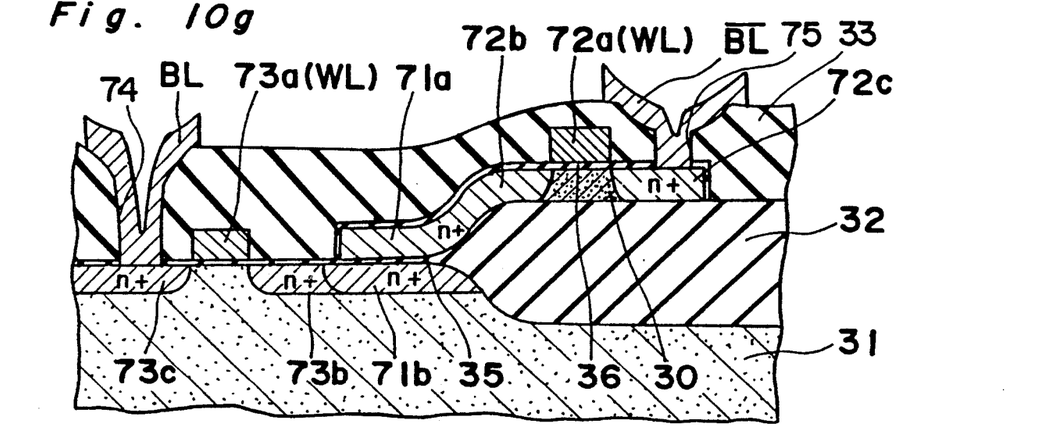

(FIG. 10g)

An insulation layer 33 is formed entirely over the transistors and capacitors, and, thereafter, windows 74 and 75 are formed for the bit lines. In this manner, a memory cell of MOSDRAM is formed.

Although the foregoing embodiment is related to a planar memory cell, the present invention is applicable also to a trench memory cell and a stack memory cell.

Figure 11:
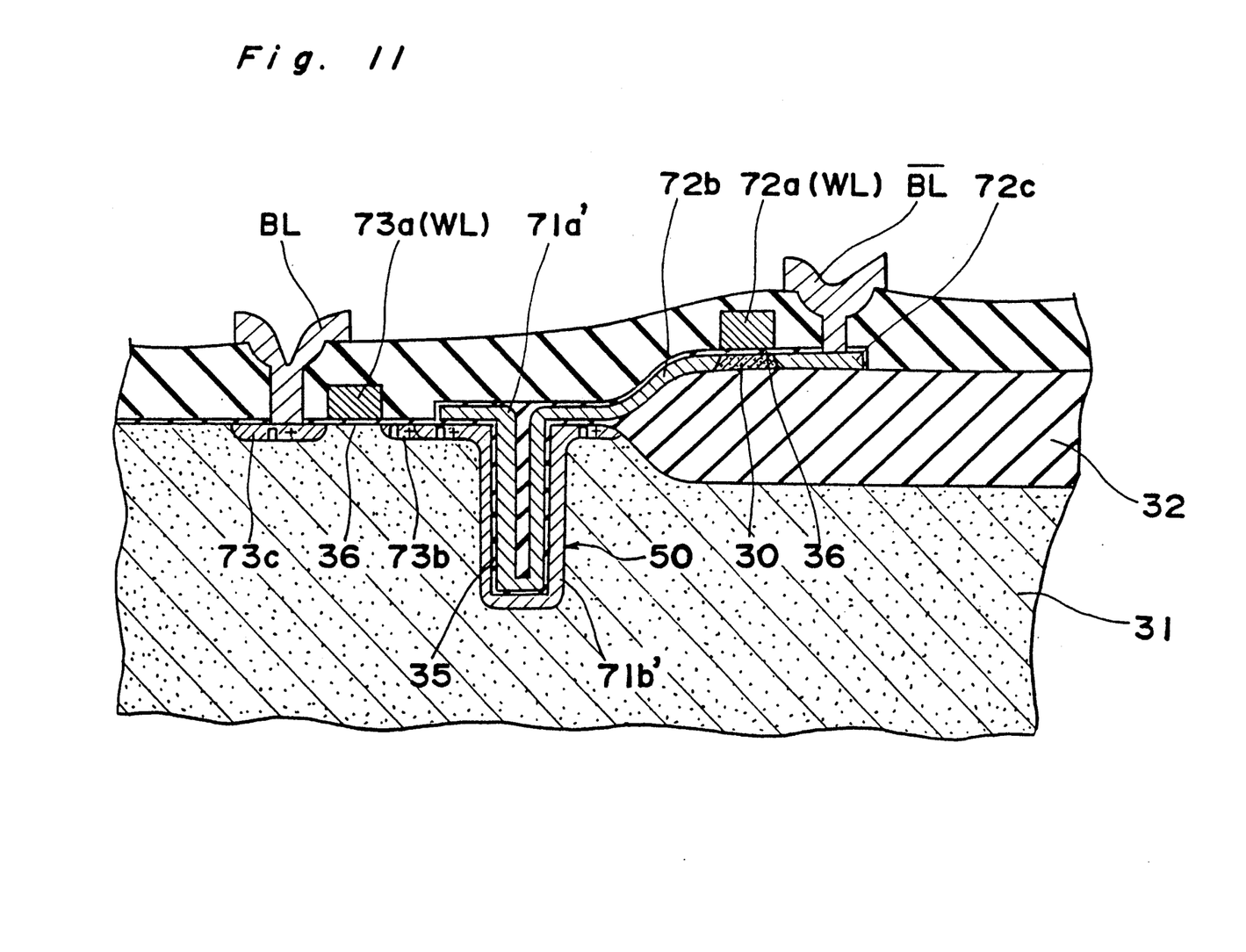
FIG. 11 is a cross-sectional view of a memory cell according to a second embodiment of the present invention.

Referring to FIG. 11, a second embodiment is shown in which the trench memory cell is employed. The trench memory cell is manufactured in the following manner.

Process 1

In the same manner as in the foregoing embodiment, a field film 32 of SiO₂ is formed on a P-type silicon substrate by the LOCOS method.

Process 2

A trench 50 is formed by a known method at a position where a memory capacitor is to be formed, with an As diffusion layer (lower electrode) 71b formed on a lateral wall of the trench.

Process 3

The same procedure as in the foregoing embodiment is carried out to produce a memory cell shown in FIG. 3.

Figure 12:
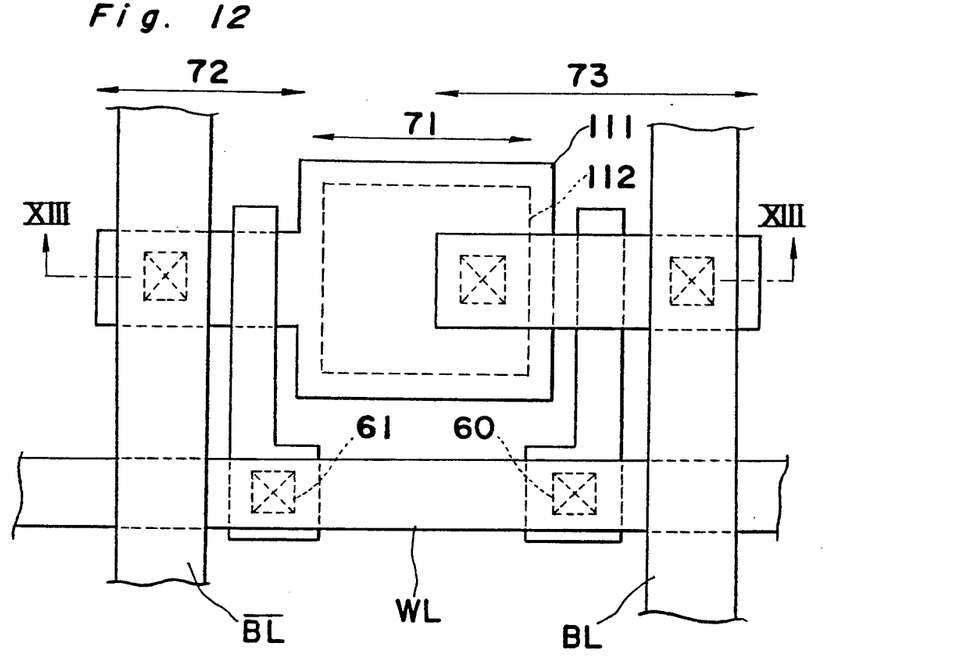
FIG. 12 is a plane view showing the structure of a memory cell according to a third embodiment of the present invention.
Figure 13:
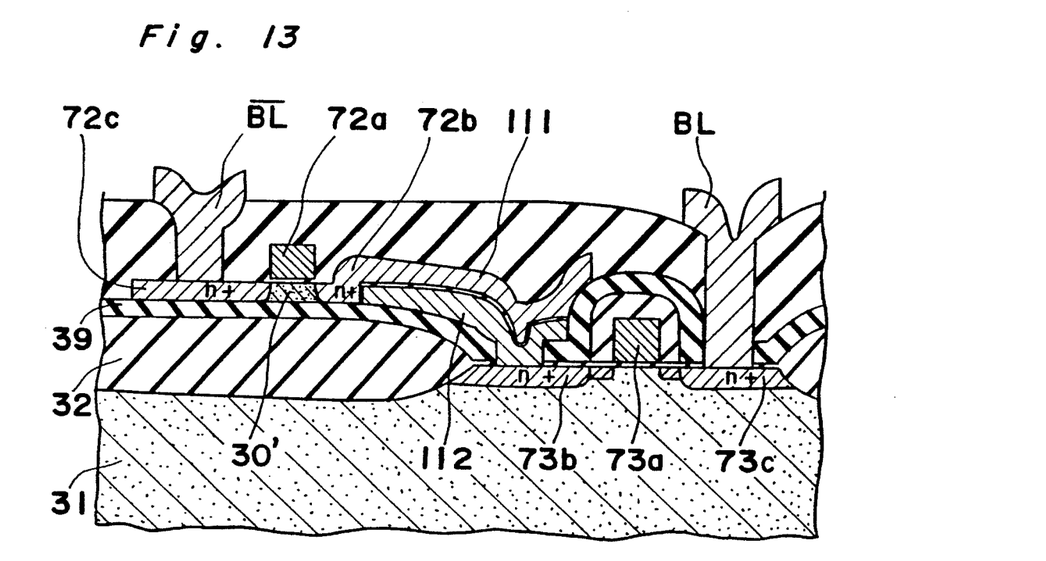
FIG. 13 is a cross-sectional view taken along a line XIII—XIII shown in FIG. 12.

Referring to FIGS. 12 and 13, a third embodiment is shown in which the stack memory cell is employed.

According to the stack memory cell shown, the first access transistor 72 is formed by a MOS transistor. Reference numbers 72a, 72b and 72c designate a gate electrode formed by polysilicon film, a source (or a drain) electrode and a drain (or a source) electrode. Similarly, the second access transistor 73 is formed by using a part of a polysilicon film 30'. Reference numbers 73a, 73b and 73c designate a gate electrode formed by polysilicon film, a source (or a drain) electrode and a drain (or a source) electrode.

The polysilicon film 30' is also used as an upper electrode for the memory capacitor 71. The lower electrode 112 of the memory capacitor 71 is formed by an electrode extending over the insulation layer 39 provided on the substrate 31. Reference numbers 60 and 61 represent connecting holes between gate electrodes 72a and 73a and the word line WL. The word line WL and bit lines BL and $\overline{BL}$ are provided in the same manner.

Referring to FIGS. 13 and 14, the steps for forming the memory cell of FIG. 12 are manufactured in the following manner.

Process 1

Figure 14A:
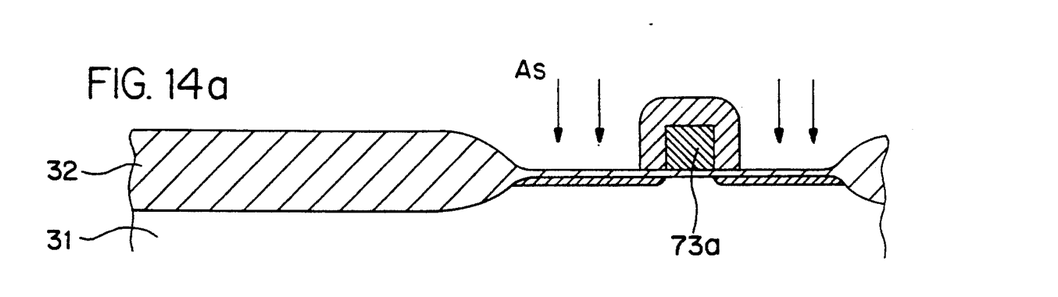
FIGS. 14a through 14d are cross-sectional views showing the steps for forming the memory cell of FIG. 12.

(FIG. 14a)

The field film 32 made of SiO₂ for separating the elements is formed on the P type silicon substrate 31 by a known method, such as LOCOS method.

A polysilicon film formed by the CVD method is doped with N type impurity, such as by phosphorous diffusion. Then, the gate electrode 73a is formed by photoetching.

Using the field film 32 of SiO₂ and the gate electrode 73a as the mask, ion injection is effected.

After the gate electrode 73a is formed, LDD (lightly doped drain) structure is formed by a known method such as an As ion injection method.

Process 2

Figure 14B:
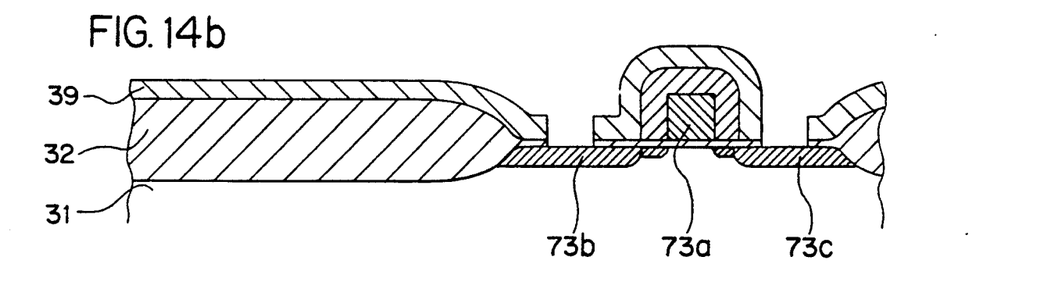

(FIG. 14b)

The insulation layer 39 such as the oxide film is formed by CVD method, and contact holes are formed at required places.

Process 3

Figure 14C:
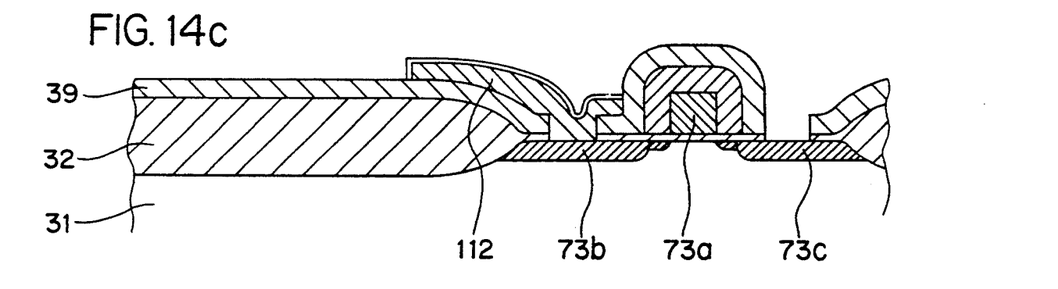

(FIG. 14c)

A polysilicon layer is formed by CVD method, and is doped with N type impurity such as phosphorus by heat diffusion or by ion injection. Then, by photoetching, the electrode 112 of one capacitor is formed.

The electrode 112 is covered by an insulation layer such as a nitride layer or any other oxide material layer.

Process 4

Figure 14D:
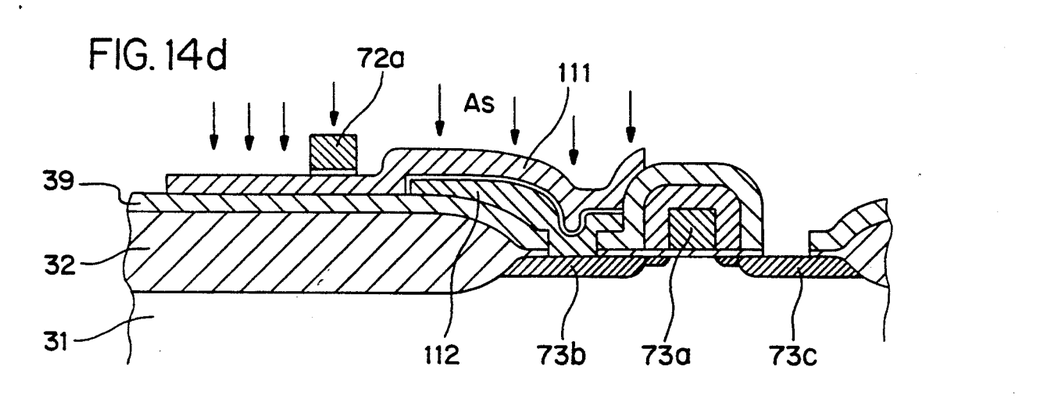

(FIG. 14d)

A polysilicon layer is formed by CVD method, and is partly removed by photoetching to form the electrode 111 of another capacitor.

After forming the gate electrode 72a, N type impurity such as As ion is doped by ion injection or by heat diffusion.

Process 5

(FIG. 13)

Bit lines are formed by a known method to complete the MOS DRAM.

In any of the foregoing embodiments, the second transistor is formed of a thin film polysilicon transistor. However, in place of polysilicon, amorphous silicon, recrystallized silicon by laser or the like may be used for the thin film transistor.

According to the second and third embodiments, the memory capacitor having a required capacitance can be formed on a substrate with a smaller area.

The present invention is characterized in that the transistors and capacitor electrodes are formed of the same material in the same layer. Because of this characteristic, when compared with the conventional memory cell, the connecting hole 22, shown in FIG. 1, is eliminated.

As is fully described hereinabove, according to the present invention, the area of a memory cell can be reduced, and accordingly the size of a chip can be minimized, which contributes to the reduction of manufacturing cost.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

I claim:

1. A method of forming a memory cell for use in a dynamic random access memory adapted store 2-bit data by the use of first and second access transistors and one capacitor, comprising the steps of:
   (a) forming a field layer and a first gate insulation layer on a substrate;
   (b) depositing a first polysilicon layer on said field layer and said first gate insulation layer;
   (c) doping said first polysilicon layer with impurities;
   (d) photoetching said doped first polysilicon layer to form a gate electrode for the first access transistor;
   (e) performing ion injections by using said field layer and said gate electrode for the first access transistor as a mask to form source and drain regions for the first access transistor in the portions of said substrate which fail to be covered by said mask;
   (f) forming a first insulation layer over said field layer, said first gate insulating layer and gate electrode for the first access transistor;
   (g) forming contact holes in first and second predetermined areas of said first insulation layer corresponding to said source and drain regions of the first access transistor;
   (h) depositing a second polysilicon layer over said first insulation layer and said contact holes;
   (i) doping said second polysilicon layer with impurities;
   (j) photoetching said doped second polysilicon layer to form a first electrode of the capacitor;
   (k) forming a second insulation layer on said first electrode of the capacitor;
   (l) depositing a third polysilicon layer over said first insulation layer and said second insulation layer;
   (m) photoetching said third polysilicon layer to form a second electrode of the capacitor;
   (n) forming a second gate insulation layer on said second electrode of the capacitor;
   (o) depositing a fourth polysilicon layer over said second gate insulation layer;
   (p) photoetching said second gate insulation layer and said fourth polysilicon layer to form a gate electrode for the second access transistor; and
   (g) doping said third polysilicon layer with impurities using said gate electrode of the second access transistor as a mask to form the source and drain regions for the second access transistor.

2. The method according to claim 1, wherein said step (a) forms said field layer of $SiO_2$ on said substrate of p type silicon by a LOCOS method.

3. The method according to claim 1, wherein said step (b) deposits said first polysilicon layer by a CVD method.

4. The method according to claim 1, wherein n type impurities are doped at said step (c).

5. The method according to claim 4, wherein the n type impurities doped at said step (c) comprise a phosphor diffusion.

6. The method according to claim 1, wherein said step (h) deposits said second polysilicon layer by a CVD method.

7. The method according to claim 1, wherein n type impurities are doped at said step (i).

8. The method according to claim 7, wherein said n type impurities comprise phosphorous.

9. The method according to claim 8, wherein said phosphor impurities are doped by heat diffusion.

10. The method according to claim 8, wherein said phosphorous impurities are doped by ion injection.

11. The method according to claim wherein said second insulation layer formed at said step (k) comprises a oxide material layer.

12. The method according to claim 1, wherein said step (l) deposits said third polysilicon layer by a CVD method.

13. The method according to claim 1, wherein n type impurities are doped at said step (q).

14. The method according to claim 13, wherein the n type impurities doped at said step (q) comprise As ions.

15. The method according to claim 14, wherein the As ions are doped at said step (q) by ion injection.

16. The method according to claim 14, wherein the As ions are doped at said step (q) by heat diffusion.

17. The method according to claim 1, further comprising the step of forming bit lines.

* * * * *

UNITED STATES PATENT AND TRADEMARK OFFICE
CERTIFICATE OF CORRECTION

PATENT NO. : 5,219,779
DATED : June 15, 1993
INVENTOR(S) : Kohei SUZUKI

It is certified that error appears in the above-identified patent and that said Letters Patent is hereby corrected as shown below:

On the title page, Item [63] Related U.S. Application Data change "Aug. 2, 1990" to --May 7, 1990--.

Signed and Sealed this

Eighth Day of March, 1994

Attest:

BRUCE LEHMAN

*Attesting Officer*  *Commissioner of Patents and Trademarks*